(12) United States Patent
Hu et al.

(10) Patent No.: US 10,417,983 B2
(45) Date of Patent: Sep. 17, 2019

(54) SHIFT REGISTER UNIT, GATE DRIVING CIRCUIT AND DISPLAY APPARATUS

(71) Applicants: BOE Technology Group Co., Ltd., Beijing (CN); Chengdu BOE Optoelectronics Technology Co., Ltd., Sichuan (CN)

(72) Inventors: Like Hu, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

(*) Notice: Subject to any disclaimer, the term of this patent is extended or adjusted under 35 U.S.C. 154(b) by 185 days.

(21) Appl. No.: 15/122,265

(22) PCT Filed: Aug. 31, 2015

(86) PCT No.: PCT/CN2015/088646
§ 371 (c)(1),
(2) Date: Aug. 29, 2016

(87) PCT Pub. No.: WO2016/123968
PCT Pub. Date: Aug. 11, 2016

(65) Prior Publication Data
US 2016/0372070 A1 Dec. 22, 2016

(30) Foreign Application Priority Data
Feb. 6, 2015 (CN) .......................... 2015 1 0062488

(51) Int. Cl.
*G11C 19/00* (2006.01)
*G09G 3/36* (2006.01)
(Continued)

(52) U.S. Cl.
CPC ............. *G09G 3/3677* (2013.01); *G09G 3/20* (2013.01); *G09G 3/36* (2013.01); *G09G 3/3614* (2013.01);
(Continued)

(58) Field of Classification Search
None
See application file for complete search history.

(56) References Cited

U.S. PATENT DOCUMENTS

| 8,019,039 B1 * | 9/2011 | Tsai | G11C 19/28 377/64 |
| 8,218,713 B2 * | 7/2012 | Hsu | G11C 19/28 377/64 |

(Continued)

FOREIGN PATENT DOCUMENTS

| CN | 102419949 A | 4/2012 |
| CN | 103137061 A | 6/2013 |

(Continued)

OTHER PUBLICATIONS

International Search Report and Written Opinion, including English translation of Box No. V, for International Application No. PCT/CN2015/088646, dated Dec. 15, 12 pages

*Primary Examiner* — Tuan T Lam
(74) *Attorney, Agent, or Firm* — Westman, Champlin & Koehler, P.A.

(57) ABSTRACT

The embodiments of the present disclosure provide a shift register unit, a gate driving circuit with bi-directional scan, and a display apparatus. The shift register unit comprises: an input module configured to provide a first input signal to a first node; a first control module configured to provide a pull-up output based on the first input signal and the third clock signal, and then provide a pull-down output; and a second control module configured to maintain a level at the output node at the source voltage based on a fourth clock (Continued)

signal. The first control module comprises a first transistor that remains on after the pull-up output to provide the pull-down output, and the second control module comprises a second transistor that maintains the level at the output node. The shift register unit according to the embodiment of the present disclosure achieves bi-directional scan with a simple design, which is beneficial for wiring in display panels with narrow rims and high resolutions. Further, since the second transistor is provided only for pull-down maintenance, a transistor of a small size can be used to further reduce the size of the circuit.

16 Claims, 8 Drawing Sheets

(51) Int. Cl.
*G09G 3/20* (2006.01)
*G11C 19/28* (2006.01)

(52) U.S. Cl.
CPC ..... *G11C 19/28* (2013.01); *G09G 2310/0267* (2013.01); *G09G 2310/0283* (2013.01); *G09G 2310/0286* (2013.01); *G09G 2310/06* (2013.01); *G09G 2310/08* (2013.01)

(56) References Cited

U.S. PATENT DOCUMENTS

| | | | | |
|---|---|---|---|---|
| 9,824,656 | B2* | 11/2017 | Chen | G09G 3/3648 |
| 9,875,709 | B2* | 1/2018 | Li | G09G 3/3677 |
| 2006/0001637 | A1 | 1/2006 | Pak et al. | |
| 2011/0157124 | A1* | 6/2011 | Jung | G11C 19/28 345/211 |
| 2012/0188210 | A1* | 7/2012 | Zhang | G09G 3/3677 345/204 |
| 2014/0055333 | A1* | 2/2014 | Lin | G09G 3/3611 345/100 |
| 2014/0119491 | A1* | 5/2014 | Liu | G11C 19/28 377/64 |
| 2015/0279481 | A1* | 10/2015 | Sasaki | G11C 19/184 377/69 |
| 2016/0049128 | A1* | 2/2016 | Shao | G09G 3/3677 345/204 |
| 2016/0071614 | A1* | 3/2016 | Lee | G09G 5/006 345/214 |
| 2016/0133337 | A1* | 5/2016 | Gu | G11C 19/28 377/64 |
| 2017/0269769 | A1* | 9/2017 | Hu | G06F 3/0416 |
| 2017/0285374 | A1* | 10/2017 | Li | G02F 1/1303 |

FOREIGN PATENT DOCUMENTS

| | | |
|---|---|---|
| CN | 103956133 A | 7/2014 |
| CN | 104318886 A | 1/2015 |
| CN | 104575436 A | 4/2015 |

* cited by examiner

Prior Art

SHIFT REGISTER UNIT, GATE DRIVING CIRCUIT AND DISPLAY APPARATUS

CROSS-REFERENCE TO RELATED APPLICATIONS

This application is a Section 371 National Stage Application of International Application No. PCT/CN2015/088646, filed on 31 Aug. 2015, and entitled with "SHIFT REGISTER UNIT, GATE DRIVING CIRCUIT AND DISPLAY APPARATUS", which claims priority to Chinese Application No. 201510062488.5, filed on Feb. 6, 2015, which are incorporated herein by reference in their entirety.

TECHNICAL FIELD

The present disclosure relates to a circuit driving technology, and more particularly, to a shift register unit, a gate driving circuit (gate driving IC) incorporating the shift register unit, and a display apparatus.

BACKGROUND

Driving circuits for a display apparatus mainly include a gate driving circuit (or scan driving circuit) and a data driving circuit (or source driving circuit). Here, the gate driving circuit includes cascaded shift register units. An input clock signal, CLK, after converted by the shift register units, will be applied to a gate line of each pixel line in the display apparatus for controlling the display apparatus on a per line basis.

SUMMARY

In an aspect, a shift register unit is provided according to an embodiment of the present disclosure. The shift register unit comprises: an input module configured to provide a first input signal to a first node based on a first clock signal; a first control module connected to the input module at the first node and configured to provide a pull-up output by providing a third clock signal to an output node of the shift register unit based on the first input signal and the third clock signal, and then provide a pull-down output by providing a source voltage to the output node based on a second input signal that is provided by the input module to the first node based on a second clock signal; and a second control module configured to maintain a level at the output node at the source voltage based on a fourth clock signal. The first control module comprises a first transistor that remains on after the pull-up output to provide the pull-down output, and the second control module comprises a second transistor that maintains the level at the output node.

In another aspect of the present disclosure, a gate driving circuit is provided. The gate driving circuit comprises the above shift register unit.

Further the gate driving circuit consists of N cascaded shift register units, where N is an integer larger than 1. Each of the shift register units, except the one at the first stage, has its first input terminal connected to the output node of the shift register unit at the previous stage, and the shift register unit at the first stage has its first input terminal connected to a first enabling signal. Each of the shift register units, except the one at the last stage, has its second input terminal connected to the output node of the shift register unit at the next stage, and the shift register unit at the last stage has its second input terminal connected to a second enabling signal. When each shift register unit shifts forward, a high level pulse of the first clock signal occurs prior to that of the third clock signal, and the first clock signal has a waveform identical to that of a voltage at the output node of the shift register unit at the previous stage. When each shift register unit shifts reversely, a high level pulse of the second clock signal occurs prior to that of the third clock signal, and the second clock signal has a waveform identical to that of a voltage at the output node of the shift register unit at the next stage.

According to yet another aspect of the present disclosure, a display apparatus is provided. The display apparatus comprises the above gate driving circuit according to the embodiment of the present disclosure.

DETAILED DESCRIPTION OF THE EMBODIMENTS

Cascaded shift register units are capable of shifting signals. Typically, a shift register unit receives an output from a shift register unit at the previous stage as its shift trigger signal, so as to output e.g., a high level signal in the next period (a period is a half of a clock cycle). Meanwhile, a shift register unit can also receive an output from a shift register unit at the next stage as its reset signal, so as to resume outputting a low level signal in the period subsequent to the next period.

In the embodiments of the present disclosure, in order to achieve bi-directional shift, the cascaded shift register units shall be capable of shifting both forward and reversely.

A clock signal is still used to provide the output of the shift register unit according to the embodiment of the present disclosure with a driving level. That is, in the period subsequent to the period in which the shift register unit at the previous (forward) or next (reverse) stage outputs a high level, the clock signal received at the first clock terminal is at the high level (here, the term "previous stage" and "next stage" refer to "previous stage" and "next stage" in the spatial order in which a number of shift register units are cascaded). Since a shift operation period (or period) of the shift register unit is a half of a clock cycle, the timing sequences of clock signals connected to the first clock terminals of shift register units at adjacent stages should be opposite. The term "timing sequence" as used herein refers to a distribution of high level periods and low level periods of a signal in the time domain. Two signals having "opposite timing sequences" means that when one signal is at the high level, the other one is at the low level, or vice versa. Two signals having "the same timing sequence" means that when one signal is at the high level, the other one is also at the high level, and when one signal is at the low level, the other one is also at the low level.

High level signals and low level signals are typically required for implementation of the shift register unit. Hence, both high level signals and low level signals are required for bi-directional scan. When switching between the forward shift and the reverse shift, the input terminals for the high level signals and the low level signals can be swapped.

In the embodiments of the present disclosure, in order to distinguish between two electrodes other than a gate in a transistor, one electrode is referred to as a source and the other one is referred to as a drain. In the form of a transistor shown in the figures, its middle terminal is a gate, its signal input terminal is a source and its signal output terminal is a drain. It can be appreciated by those skilled in the art that each unipolar transistor as used in the embodiments of the present disclosure can be either a P-type switching transistor which is turned on when its gate is at the low level and turned off when its gate is at the high level, or an N-type switching transistor which is turned on when its gate is at the high level and turned off when its gate is at the low level.

Figure 1:
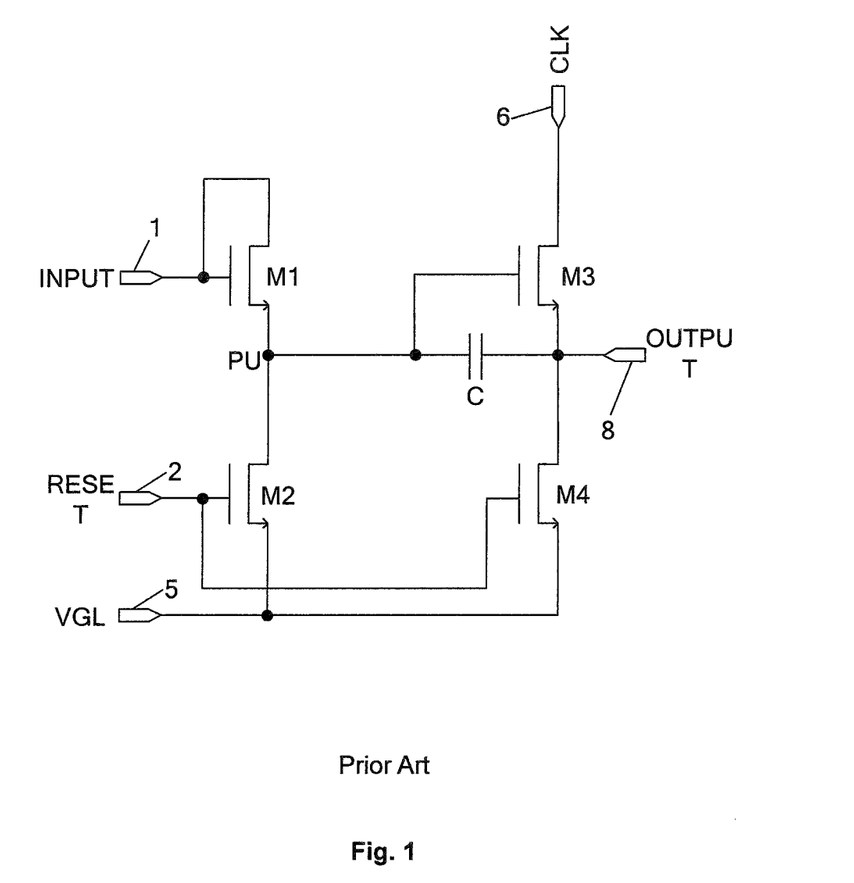
FIG. 1 is a circuit diagram of a conventional shift register unit.

As shown in FIG. 1, a conventional circuit for a shift register unit includes four transistors, i.e., a first transistor M1, a second transistor M2, a third transistor M3 and a fourth transistor M4, and one capacitor C.

The first transistor M1 has its gate connected to its source and to a first input terminal 1. The first input terminal 1 receives an input signal, INPUT, which originates from an output signal, OUTPUT, from a shift register unit at a previous stage.

The second transistor M2 has its gate connected to a second input terminal 2 for receiving a reset signal, RESET, and its drain connected to a constantly low level terminal 5 for receiving a low level signal, VGL.

The third transistor M3 has its source connected to a clock terminal 6, which is configured to receive a clock signal CLK, and its gate connected to an output terminal 8 via the capacitor C.

The fourth transistor M4 has its gate connected to a second terminal 2, its drain connected to the constantly low level terminal VGL, and its source connected to the output terminal 8.

The node between the drain of the first transistor M1 and the source of the second transistor M2 is a pull-up node, PU. The output signal, OUTPUT, from the output terminal 8 is a gate scan signal for the shift register unit at the same stage.

The input signal, INPUT, to the shift register unit at a stage is at a high level and the first transistor is turned on to pre-charge the pull-up node PU when the shift register unit at the previous stage is performing a gate scan. In the next period, the clock signal, CLK, for the shift register unit at the stage is at the high level and the third transistor M3 is turned on such that the output terminal 8 is at the high level, i.e., the output signal, OUTPUT, is at a high level. Meanwhile, due to a bootstrap effect, the potential at the pull-up node, PU, becomes high again. In the next period, the output signal from the shift register unit at the next stage is at the high level, i.e., the reset signal, RESET, at the second input terminal 2, is at the high level, and the second transistor M2 and the fourth transistor M4 are turned on to discharge and thus reset the pull-up node, PU, and the output terminal 8.

Such shift register unit is disadvantageous in that the period during which the high level is applied to the fourth transistor M4 is so short that it will not drift due to a DC bias. In most of the time the PU and the OUTPUT are floating and susceptible to parasitic capacitances, thereby causing misoperations. As a result, a display device will have a non-uniform luminance and thus a degraded product quality. In addition, such shift register unit is not capable of bi-directional scan and has a large size of circuit.

The shift register unit according to the present disclosure achieves bi-directional scan with a simple design, such that the structure of the gate driving circuit can be simplified and the associated cost can be reduced. Further, the switching between a forward scan and a reverse scan can be achieved by simply matching the timing sequences of the control signals and the input signals, such that the number of control signals required in the circuit can be reduced (as most of the conventional shift register units require two additional direction control signals), which is beneficial for wiring in display panels with narrow rims and high resolutions. Further, since the second transistor is provided only for pull-down maintenance, a transistor of a small size can be used to further reduce the size of the circuit.

The present disclosure will be explained in further details with reference to the figures, taken in conjunction with the embodiments, such that the objects, solutions and advantages of the present disclosure will become more apparent.

[First Embodiment]

Figure 2:
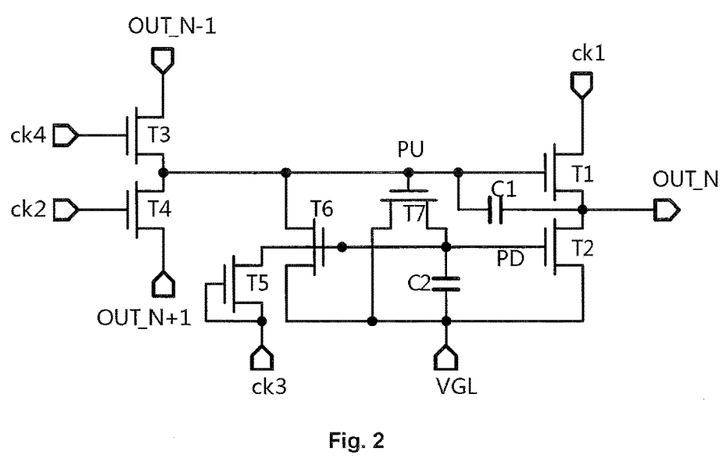
FIG. 2 is a circuit diagram showing a structure of a shift register unit according to a first embodiment of the present disclosure.

The first embodiment relates to a basic circuit for a shift register unit according to the present disclosure, as well as a basic cascaded circuit of a gate driving circuit consisting of the shift register units. FIG. 2 shows a circuit diagram of a shift register unit according to the first embodiment. In the following embodiments, it is assumed that each switching transistor is an N-type transistor as an example. However, it can be appreciated that the embodiments of the present disclosure may alternatively be implemented with P-type transistors.

Next, the structure of the shift register unit according to the first embodiment of the present disclosure will be described in detail with reference to FIG. 2. As shown in FIG. 2, the shift register unit can include:

an input module configured to provide an input signal, OUT_N−1, to a first node (pull-up node, PU) based on a first clock signal (one of ck4 and ck2);

a first control module connected to the input module at the first node and configured to provide a pull-up output by providing a third clock signal, ck1, to an output node, OUT_N, of the shift register unit based on the input signal, OUT_N−1, and the third clock signal, ck1, and then provide a pull-down output by providing a source voltage (VGL) to the output node based on an input signal, OUT_N+1, that is provided by the input module to the first node, PU, based on a second clock signal (the other one of ck4 and ck2); and a second control module configured to maintain a level at the output node at the source voltage (VGL) based on a fourth clock signal, ck3.

The first control module includes a first transistor, T1, that remains on after the pull-up output to provide the pull-down output. The second control module includes a second transistor, T2, that maintains the level at the output node.

The respective components of the shift register unit according to this embodiment will be explained in detail below with reference to FIG. 2.

As shown in FIG. 2, the input module can include: a third transistor, T3, having its gate connected to the clock signal, ck4, its source connected to the input signal OUT_N−1, and its drain connected to the first node PU; and a fourth transistor, T4, having its gate connected to the clock signal ck2, its drain connected to the input signal OUT_N+1, and its source connected to the first (pull-up) node, PU. It is to be noted here that a first capacitance, C1, is provided between the gate and the drain of the first transistor T1, as a voltage maintenance capacitance for the pull-up node PU. The input signal OUT_N−1 is an output signal from the previous stage relative to the output signal OUT_N from the shift register unit at the current stage and has an initial value of STV. For example, it can be a signal SIU in the case of forward shift, or a signal SID in the case of reverse shift. The input signal OUT_N+1 is an output signal from the next stage relative to the output signal OUT_N from the shift register unit at the current stage.

The first control module can include: a first transistor T1 having its gate connected to the first node PU, its source connected to the clock signal ck1 and its drain connected to the output node OUT_N of the shift register unit; and a seventh transistor, T7, having its gate connected to the first node PU, its source connected to a terminal of a second capacitance, C2, at a second node (pull-down node, PD), and its drain connected to the source voltage (VGL). The second capacitance C2 has another terminal connected to the source voltage (VGL) and serves as a voltage maintenance capacitance for the second node PD.

It can be appreciated by those skilled in the art that the first capacitance C1 and the second capacitance C2 can be provided by inherent parasitic capacitances or additional capacitors between the transistors.

The second control module can include: a second transistor, T2, having its gate connected to the pull-down node PD, its drain connected to the negative source voltage VGL and its source connected to the output node OUT_N; a fifth transistor, T5, having its gate and drain connected to the clock signal ck3 and its source connected to the pull-down node PD; and a sixth transistor, T6, having its gate connected to the second node PD, its source connected to the first node PU and its drain connected to the source voltage (VGL).

As shown in FIG. 2, the shift register unit according to this embodiment is controlled by four clock signals, ck1-ck4. The third transistor T3 and the fourth transistor T4 are provided to achieve the bi-directional scan function. The first transistor T1 can be turned on to pull down the voltage at the output node after it has been pulled up. The second transistor T2 is a pull-down maintenance transistor. The fifth transistor T5 controls the voltage at the pull-down node PD, so as to pull up the pull-down node PD. The sixth transistor T6 controls the voltage at the pull-up node PU to continuously pull down the PU node when the PD node is at the high level, such that the first transistor T1 will be turned off. The seventh transistor T7 is a control transistor for the pull-down node PD, which maintains the PD node at the low level while the PU node is at the high level, such that the pull-down transistor T2 is turned off. With the above circuit structure, in combination with the timings of the clock signals, the first transistor T1 remains on, after the pull-up output, for pulling down. In this way, the second transistor T2 is provided only for maintaining the output from the shift register unit at a low voltage, such that the output of the shift register unit is controlled only by the first transistor T1.

Hence, the size of the second transistor T2 can be reduced as appropriate, which is advantageous for wiring in narrow rims. A ratio of the size of the first transistor T1 to that of the second transistor T2 can be approximately 30:1~1:1, preferably 6:1~3:1.

A smaller size is very advantageous for the reliability of the second transistor T2 which operates with a positive bias for a long time. This is because only the sixth transistor T6 and the second transistor T2 operate at a high duty cycle of over 95% and they can both guarantee the normal operations of the circuit with minimum sizes. The voltage at the pull-down node PD is also lower than the high level in the circuit (for NMOS circuit) and the reliability of the circuit can be improved.

It can be appreciated by those skilled in the art that the sizes of the transistors as described above are dependent on the load to which the shift register unit is connected and thus cannot be represented directly as particular numeric values. The structure according to the present disclosure can reduce the size of the pull-down transistor T2, which means that, given the same load, the size of the pull-down transistor T2 can be reduced when compared with a shift register unit not having such structure. That is, it is a relative result, instead of a specific value.

Figure 3:
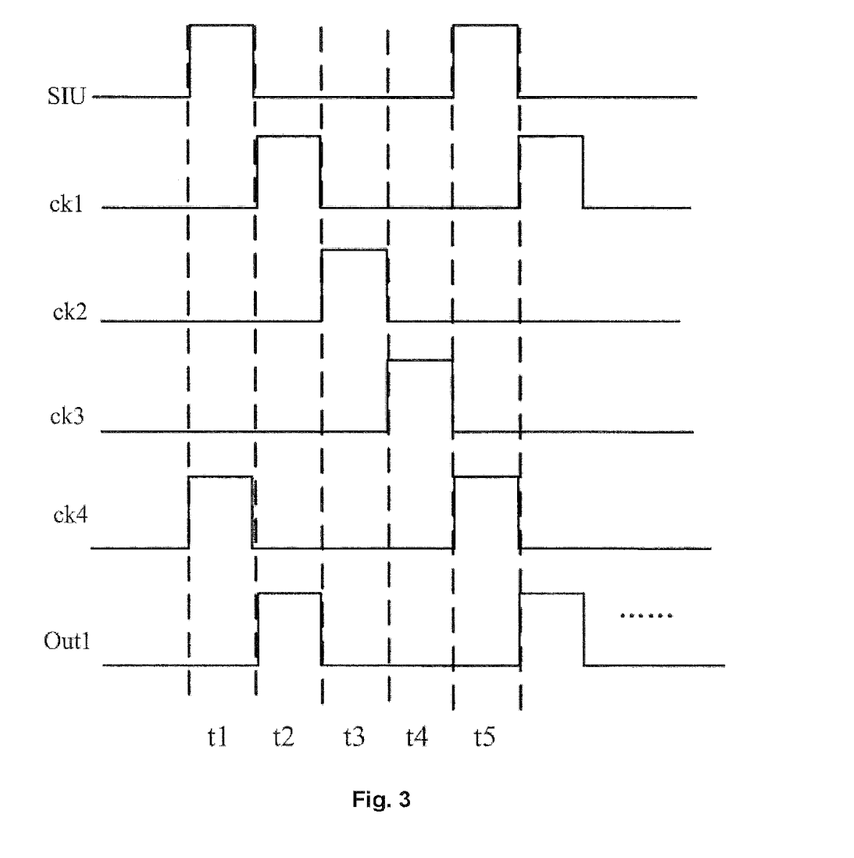
FIG. 3 is a schematic diagram showing a signal timing sequence for a shift register unit according to a first embodiment of the present disclosure.

FIG. 3 shows a signal timing sequence when the shift register unit according to this embodiment is configured for forward shift. Next, the operation principles of the shift register unit according to this embodiment will be described with reference to FIGS. 2 and 3.

As shown in FIG. 3, in the first phase (t1), ck4 is synchronized with the pulses of SIU. SIU and ck4 are at the high level and the other clock signals are at the low level. When a valid SIU (which is at the high level in the case of NMOS transistor) is inputted, the third transistor T3 controlled by ck4 is turned on, such that the high level signal of SIU is transmitted to the gate of the first transistor T1 to turn on the first transistor T1 and charge the first capacitance C1. Meanwhile, the signal also turns on the seventh transistor T7. In this case, the voltage at the pull-up node PU is pulled up and the voltage at the pull-down node PD is gradually pulled down by the voltage at PU. Both terminals of the second capacitance C2 are at the low level. In this case, ck1 is at the low level and the first transistor T1 is turned on to charge the first capacitance C1. The voltage, Out1, at the output node OUT_N is at the low level.

In the second phase (t2), ck1 is at the high level, the other clock signals are at the low level and the SIU signal becomes low. The voltage Out1 at the output node OUT_N jumps from the low level to the high level. The bootstrap effect of the first capacitance C1 pumps the voltage at the PU node to the high level, which allows the first transistor T1 to fully output the high level of ck1 to the output node OUT_N. In this case, the seventh transistor T7 is turned on and the voltage at the pull-down node PD is pulled down.

In the third phase (t3), ck2 is at the high level, the other clock signals are at the low level and the SIU signal remains at the low level. Since ck2 is at the high level, the fourth transistor T4 is turned on. Since the fourth transistor T4 is turned on, the voltage at the pull-up node PU does not bootstrap any more, but still maintains the first transistor T1 to be turned on and the voltage Out1 at the output node OUT_N jumps from the high level to the low level. Hence, when the clock signal ck4, ck1 or ck2 is at the high level, the first transistor T1 is turned on, the voltage at the pull-down node PD is at the low level and the second transistor T2 is turned on.

In the fourth phase (t4), ck3 is at the high level, the other clock signals are at the low level and the SIU signal remains at the low level. Since ck3 is at the high level, the fifth transistor T5 is turned on, thereby pulling up the level at the pull-down node PD and charging the second capacitance C2. The second transistor T2 is turned on and the output node is maintained at the low level. The sixth transistor T6 pulls down the voltage at the pull-up node PU, such that the first transistor T1 is in the off state.

In the fifth phase (t5), ck4 is at the high level, the other clock signals are at the low level, and the SIU signal becomes high. In this case, the third transistor T3 controlled by ck4 is turned on and the above steps in the first phase will be repeated. In this way, the operations of the shift register unit in the next period are started.

Figure 4:
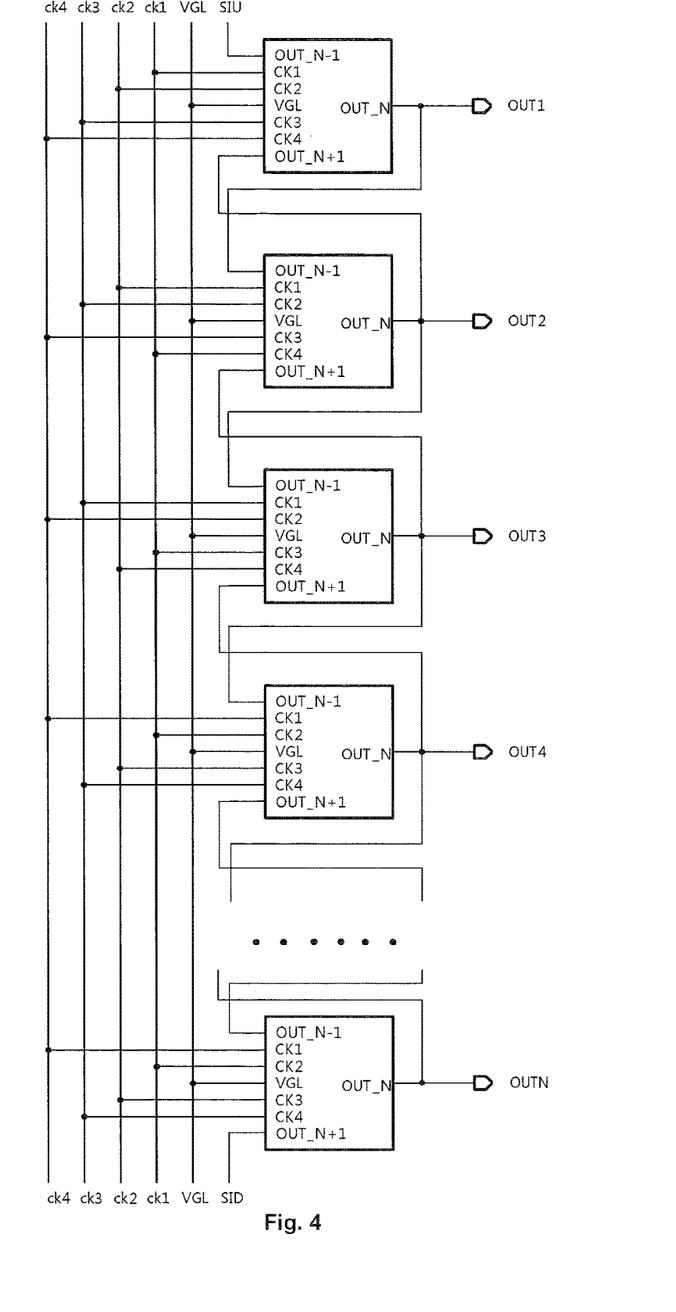
FIG. 4 is a schematic diagram showing a cascaded structure of a gate driving circuit according to a first embodiment of the present disclosure.

FIG. 4 shows a cascaded structure of a gate driving circuit according to a first embodiment of the present disclosure. The gate driving circuit according to this embodiment consists of cascaded shift register units. Accordingly, shifting operations by the shift register units allow progressive scanning of the pixel lines. In the figure, SIU and SID are input enabling pulse signals for forward and reverse scans, respectively.

As shown in FIG. 4, in this embodiment, each shift register unit, SRn, except the one at the first stage, SR1, has its first input terminal, OUT_N−1, connected to the output of the shift register unit at the previous stage, SRn−1, and the shift register unit at the first stage SR1 has its first input terminal OUT_N−1 connected to the input enabling signal SIU. Each shift register unit SRn, except the one at the last stage, SRN, has its second input terminal, OUT_N+1, connected to the output of the shift register unit at the next stage, SRn+1, and the shift register unit at the last stage SRN has its second input terminal OUT_N+1 connected to the enabling signal SID.

As shown in FIG. 4, in this shift register, the high level signal in the output signal timing sequence of a shift register unit is delayed by one period when compared with that of a shift register unit at the previous stage. In particular, the clock signals for four consecutive shift register units (at stages i, i+1, i+2 and i+3, respectively) satisfy the following relationships:

(1) For the shift register unit at stage i, the clock signals inputted to its clock signal input terminals CK1, CK2, CK3 and CK4 are ck1, ck2, ck3 and ck4, respectively.

(2) For the shift register unit at stage i+1, the clock signals inputted to its clock signal input terminals CK1, CK2, CK3 and CK4 are ck2, ck3, ck4 and ck1, respectively.

(3) For the shift register unit at stage i+2, the clock signals inputted to its clock signal input terminals CK1, CK2, CK3 and CK4 are ck3, ck4, ck1 and ck2, respectively.

(4) For the shift register unit at stage i+3, the clock signals inputted to its clock signal input terminals CK1, CK2, CK3 and CK4 are ck4, ck1, ck2 and ck3, respectively.

It can be appreciated by those skilled in the art that the clock signals inputted to the shift register unit at stage i+4 is the same as the clock signals inputted to the shift register unit at stage i, i.e., the clock signals inputted to its clock signal input terminals CK1, CK2, CK3 and CK4 are ck1, ck2, ck3 and ck4, respectively, and so on.

It is to be noted here that the above i is an integer larger than or equal to 1, and i+3≤N.

For one of the shift register units SRn, for forward shift, its input terminal OUT_N−1 receives an output signal, OUTi−1, from the shift register unit SRn−1 at the previous stage, or the enabling signal SIU, as its enabling signal for controlling the operations of the shift register unit. For reverse shift, its input terminal OUT_N+1 receives an output signal, OUTi+1, from the shift register unit SRn+1 at the next stage, or the enabling signal SID, as its enabling signal.

It can be appreciated by those skilled in the art that the number of the cascaded shift register units can be determined as desired and may be any number larger than or equal to 2, as long as their clock signals are shifted in the order as described above.

With the cascaded structure of the shift register units according to this embodiment, the switching between the forward scan and the reverse scan can be achieved by simply matching the timing sequences of the control signals and the input signals, such that the number of control signals required in the circuit can be reduced (as most of the conventional shift register units require two additional direction control signals), which is beneficial for wiring in display panels with narrow rims and high resolutions.

Figure 5:
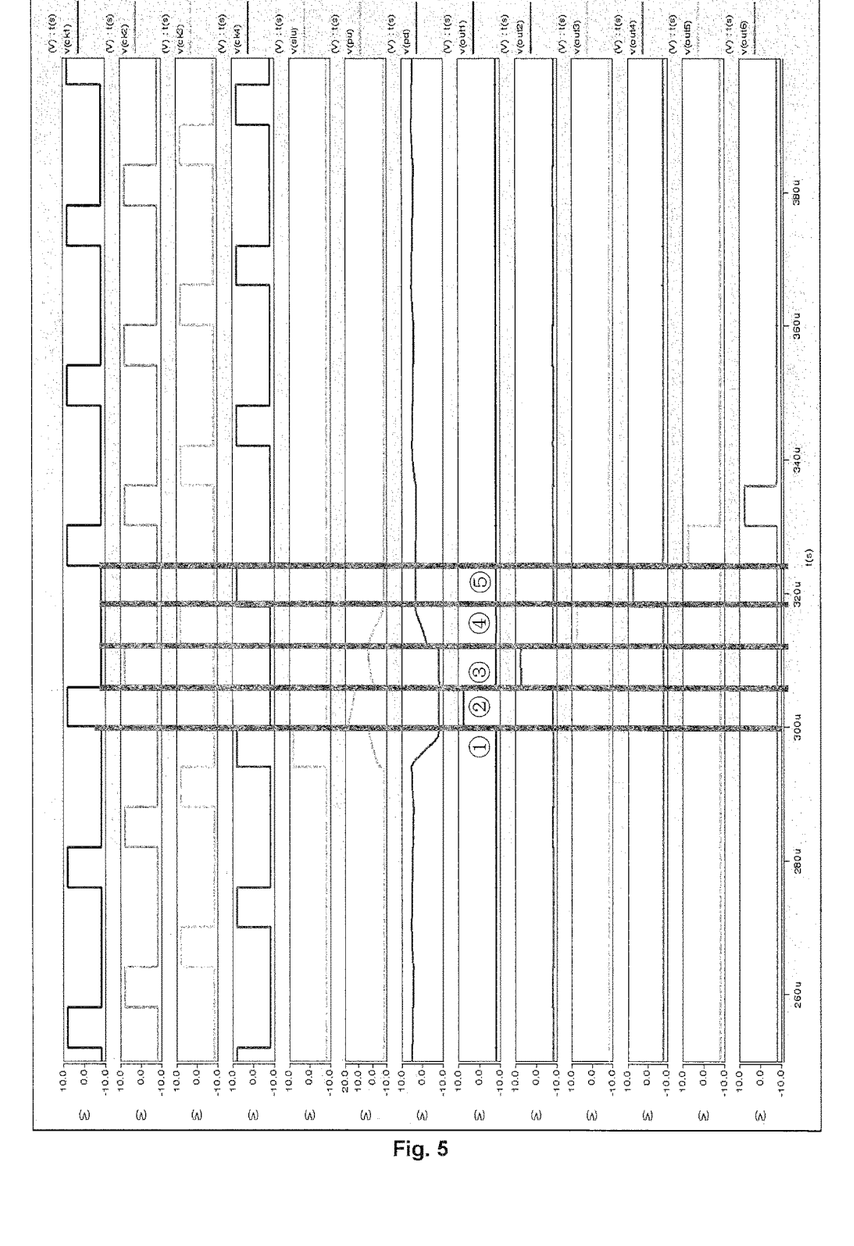
FIG. 5 is a schematic diagram showing a signal timing sequence for a forward scan according to the embodiment shown in FIG. 4.
Figure 6:
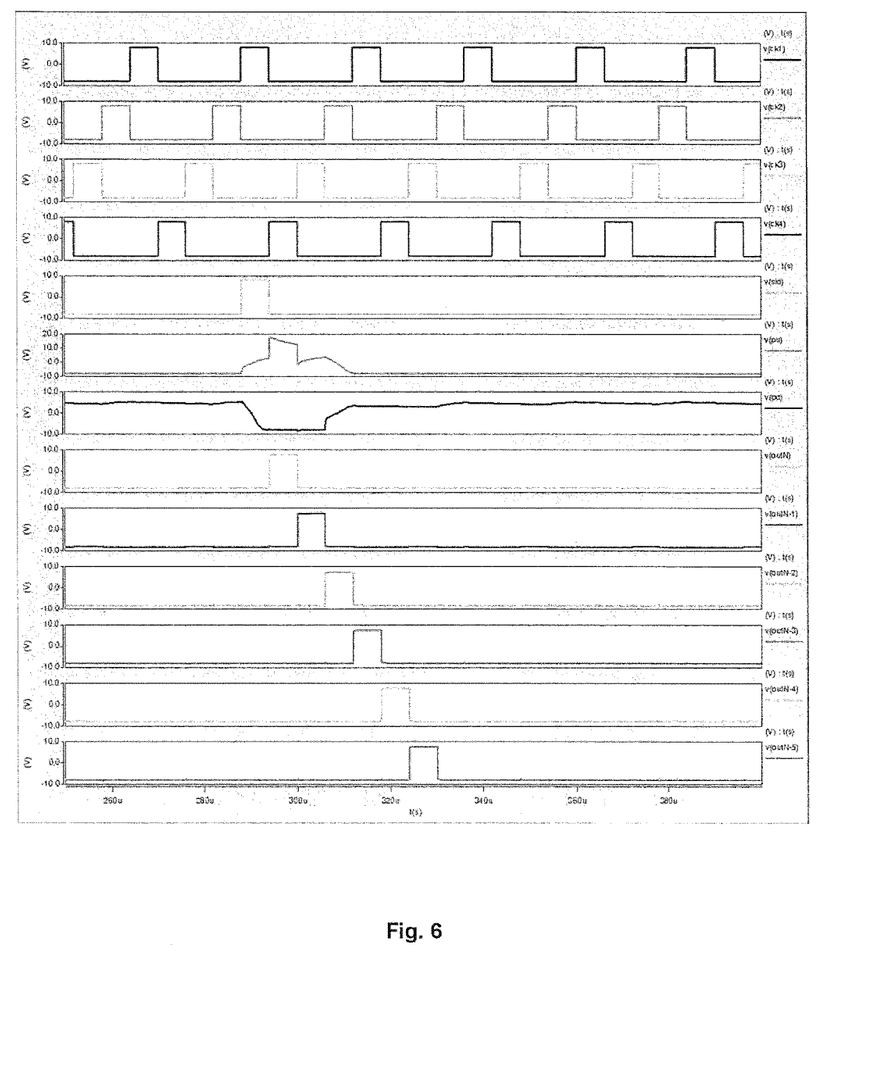
FIG. 6 is a schematic diagram showing a signal timing sequence for a reverse scan according to the embodiment shown in FIG. 4.

FIGS. 5 and 6 show signal timing sequences for a forward scan and a reverse scan according to the first embodiment, respectively.

The signal timing sequence when a gate driver shifts forward and applies a forward scan to pixel lines as shown in FIG. 5 will be described in conjunction with FIGS. 1 and 4. For the purpose of illustration, the shift register units shown in FIG. 4 are referred to, from top to bottom, as a shift register unit at stage 1, a shift register unit at stage 2, a shift register unit at stage 1, a shift register unit at stage 4, and a shift register unit at stage 5, corresponding to the above shift register units at stages i to i+4, respectively.

First, the enabling signal SIU connected to the input terminal OUT_N−1 of the shift register unit at stage 1 and the clock signal ck4 connected to the input terminal CK4 are at the high level, and the other clock signals and the signal connected to the input terminal OUT_N+1 are at the low level. This period is referred to here as a first period (① in FIG. 5). In this case, the third transistor T3 is turned on, such that the high level signal of SIU is transmitted to the gate of the first transistor T1 to turn on the first transistor T1 and charge the first capacitance C1. Meanwhile, the seventh transistor T7 is turned on. In this case, the voltage at the pull-up node PU is pulled up and the voltage at the pull-down node PD is gradually pulled down by the voltage at PU. Both terminals of the second capacitance C2 are at the low level. In this case, the clock signal ck1 connected to the input terminal CK1 is at the low level and the voltage Out1 at the output node is at the low level. This period may also be referred to as a pre-charging period for this stage.

In the second period (② in FIG. 5), the clock signal ck1 connected to the input terminal CK1 becomes high and the enabling signal SIU becomes low. The third transistor T3 is turned off and the pull-up node PU remains at the high level. The clock signal ck1 connected to the input terminal CK1 becomes high, the voltage at the output node jumps from the low level to the high level, i.e., the high level is outputted at OUT1 in FIG. 4. The bootstrap effect of the first capacitance C1 pumps the voltage at the PU node to the high level, which allows the first transistor T1 to fully output the high level of ck1 to the output node. In this case, the seventh transistor T7 is turned on and the voltage at the pull-down node PD is pulled down. This period is a period during which the shift register unit at this stage performs scanning and can thus be referred to as a scan period for this stage. Meanwhile, OUT1 is inputted to the input terminal OUT_N−1 of the shift register unit SR2 at stage 2 (i.e., the next stage). The clock signal ck1 connected to the input terminal ck4 of the shift register unit SR2 at stage 2 is at the high level. Hence, the shift register unit SR2 at stage 2 performs the same operations as those performed by the shift register unit SR1 at stage 1 in the first period.

In the third period (③ in FIG. 5), the clock signal ck2 is at the high level, the other clock signals are at the low level and the fourth transistor T4 is turned on. Since the fourth transistor T4 is turned on, the voltage at the pull-up node PU does not bootstrap any more, but still maintains the first transistor T1 to be turned on and the voltage at the output node changes from the high level to the low level. This period can be referred to as a reset period for this stage. The Out1 inputted to the input terminal OUT_N−1 of the shift register unit SR2 at stage 2 is at the low level and the clock signal ck2 connected to the input terminal CK1 of the shift register unit at stage 2 is at the high level. Hence, the shift register unit SR2 at stage 2 performs the same operations as those performed by the shift register unit SR1 at stage 1 in the second period. The Out2 is at the high level. This period is a scan period for stage 2. Meanwhile, the OUT2 at the high level is inputted to the input terminal OUT_N−1 of the shift register unit SR3 at stage 3 and the clock signal ck2 connected to the input terminal CK4 of the shift register unit SR3 at stage 3 is at the high level. Hence, the shift register unit SR3 at stage 3 performs the same operations as those performed by the shift register unit SR1 at stage 1 in the first period.

In the next, fourth period (④ in FIG. 5), the clock signal ck3 is at the high level and the other clock signals are at the low level. The fifth transistor T5 is turned on, thereby pulling up the level at the pull-down node PD and charging the second capacitance C2. The second transistor T2 is turned on and the output OUT1 is maintained at the low level. This period is also referred to as a reset period for this stage. The sixth transistor T6 pulls down the voltage at the pull-up node PU, such that the first transistor T1 is in the off state. The Out1 inputted to the input terminal OUT_N−1 of the shift register unit SR2 at stage 2 is at the low level and the clock signal ck3 connected to the input terminal CK2 of the shift register unit at stage 2 is at the high level. Hence, the shift register unit SR2 at stage 2 performs the same operations as those performed by the shift register unit SR1 at stage 1 in the third period. The Out2 is at the low level. Meanwhile, the OUT2 is inputted to the input terminal OUT_N−1 of the shift register unit SR3 at stage 3 and the clock signal ck3 at the high level is connected to the input terminal CK1 of the shift register unit SR3 at stage 3. Hence, the shift register unit SR3 at stage 3 performs the same operations as those performed by the shift register unit SR1 at stage 1 in the second period. The OUT3 is at the high level. This period is a scan period for stage 3. Meanwhile, the OUT3 at the high level is inputted to the input terminal OUT_N−1 of the shift register unit SR4 at stage 4 and the clock signal ck3 at the high level is connected to the input terminal CK4 of the shift register unit SR4 at stage 4. Hence, the shift register unit SR4 at stage 4 performs the same operations as those performed by the shift register unit SR1 at stage 1 in the first period.

In the next, fifth period (⑤ in FIG. 5), the enabling signal SIU and the clock signal ck4 are at the high level and the operations in the first period are repeated.

In this embodiment, the clock signals ck4 and ck2 can be simply swapped in order to achieve the reverse shift and thus the reverse scan. The forward scan can be provided when the high level pulse of the clock signal ck4 occurs prior to that of the clock signal ck1 and the clock signal ck4 is synchronized with OUT_N−1. The reverse scan can be provided when the high level pulse of the clock signal ck2 occurs prior to that of the clock signal ck1 and the clock signal ck2 is synchronized with OUT_N+1. FIGS. 5 and 6 show the corresponding waveforms, where SID is the enabling signal for the reverse scan.

That is, the switching between the forward shift and the reverse shift can be achieved by simply swapping the connection positions of the clock signals ck4 and ck2, without changing the connections associated with the input terminals OUT_N−1 and OUT_N+1. In this way, in both the forward scan and the reverse scan, the first transistor T1 and the second transistor T2 can pre-charge the pull-up node PU in a period before the shift register unit scans a current line, and discharge the pull-up node PU in a period after the shift register unit has scanned the current line. In both the forward scan and the reverse scan, the input terminal OUT_N−1 can receive a valid enabling signal in a period before the shift register unit scans a current line, so as to control the shift register unit at this stage to output a high level signal in a current period and output a low level signal after the current line has been scanned. The timing sequence for the reverse scan is shown in FIG. 6 and the description thereof will be omitted here.

It can be appreciated by those skilled in the art that SIU and SID can be the same signal and only the match between the timings of the clock control signals needs to be adjusted. It is to be noted here that when SIU and SID are the same signal, in order for the forward and reverse scans to operate properly, the first and last stages of the shift register unit circuit should be connected to different clock signals, so as to prevent an enabling pulse from being inputted to the first and last stages of the circuit simultaneously.

The first embodiment utilizes a simple circuit, including only seven transistors and two capacitors, to achieve the function of bi-directional shift. Further, when a shift register unit is scanning, the pull-up node PU is maintained at a high voltage due to the bootstrap effect, thereby ensuring the stability of the output.

[Second Embodiment]

Figure 7:
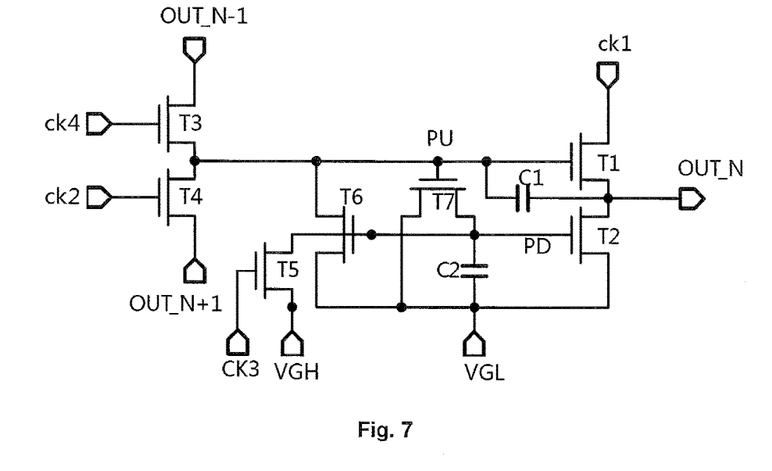
FIGS. 7 and 8 are circuit diagrams each showing a structure of a shift register unit according to a second embodiment of the present disclosure.
Figure 8:
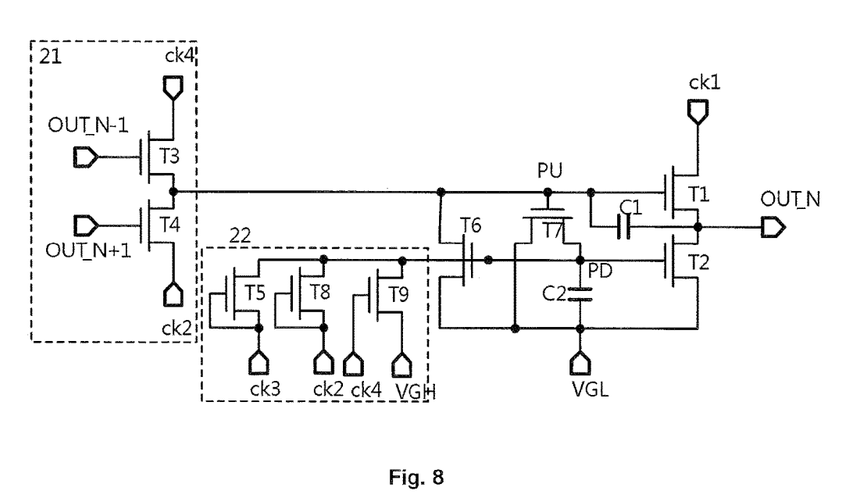

The second embodiment involves improvements to the first embodiment. This embodiment and the first embodiment are the same in the cascaded scheme of the gate driving circuit, but differ from each other in the structure of each shift register unit. FIGS. 7 and 8 show the circuit structure of the shift register unit according to the second embodiment.

Variant 1

In the solution according to the first embodiment, only the clock signal ck3 is used to control the fifth transistor T5 and only a capacitive maintenance is used to ensure the proper operation of the circuit. As shown in FIG. 1, the first embodiment employs a diode-connected solution. As shown in FIG. 7, the fifth transistor T5 in the second embodiment has its drain connected to a high level VGH.

Variant 2

As shown in FIG. 8, unlike the first embodiment, in the input module 21 of the shift register unit according to the second embodiment, the third transistor T3 has its gate connected to the input signal OUT_N+1 and its source connected to the clock signal ck4, and the fourth transistor T4 has its gate connected to the input signal OUT_N+1 and its drain connected to the clock signal ck2.

Variant 3

The pull-down module of the shift register unit according to the second embodiment further includes an eighth transistor T8 and a ninth transistor T9. The eighth transistor T8 has its drain connected to its gate and to the clock signal ck2, and its source connected to the pull-down node PD. The ninth transistor T9 has its gate connected to the clock signal ck4, its source connected to the pull-down node PD, and its drain connected to the positive source voltage VGH.

Compared with the technical solution of the first embodiment, in the solution of the second embodiment, the input signals to the third transistor T3 and the fourth transistor T4 are swapped, while the functionality of the circuit remains unchanged. It is to be noted here that, preferably as shown in FIG. 2, the clock signals ck4 and ck4 are inputted to the gates of the third and fourth transistors, respectively, such that it is possible to continue pulling down the PU after a normal output without any leakage. If OUT_N−1 and OUT_N+1 are outputted to the gates, and ck2 and ck4 are connected to the sources or drains, respectively, it may cause a risk that the potential at the PU node may be pulled up due to leakage at T3 and T4.

Second, the ninth transistor T9 is introduced to receive the clock signal ck4, so as to pull up the level at the pull-down node PD, thereby reducing the value of the second capacitance C2 or simply using a parasitic capacitance to provide the second capacitance. Further, the eighth transistor T8 is introduced and the clock signal ck2 is applied to T8 to further pull up the level at the pull-down node PD.

Any one of the above three variants, or any combination thereof, can be implemented to provide more variants as alternatives to the first embodiment.

[Third Embodiment]

Figure 9:
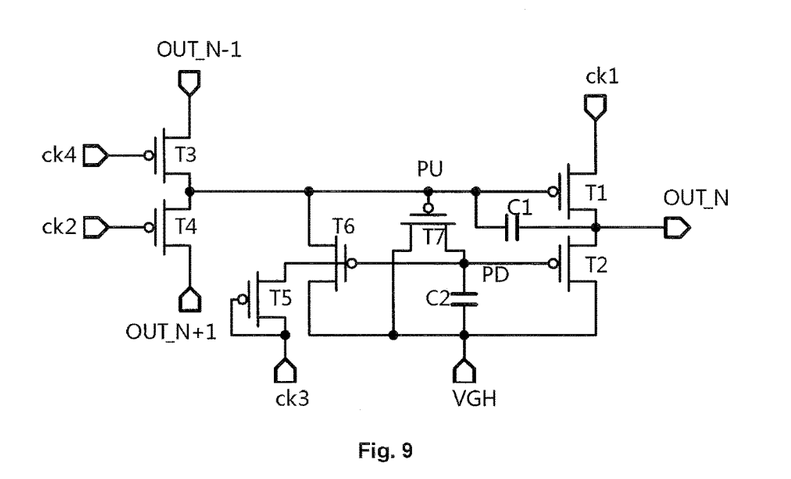
FIG. 9 is a circuit diagram showing a structure of a shift register unit according to a third embodiment of the present disclosure.

The third embodiment involves another improvement to the shift register unit by replacing the NMOS transistors in the first embodiment with PMOS transistors. As shown in FIG. 9, the third embodiment can be implemented using the same structure as that of the first embodiment for the NMOS transistors, with the source voltage being changed from VGL to VGH.

[Fourth Embodiment]

Figure 10:
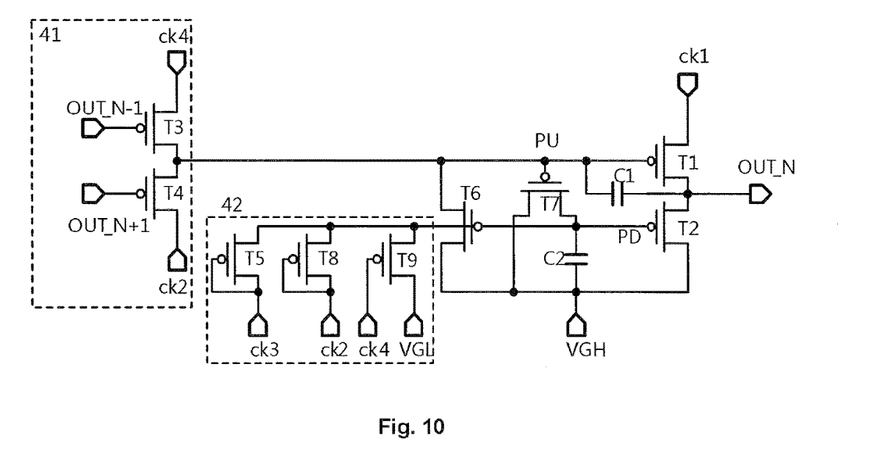
FIG. 10 is a circuit diagram showing a structure of a shift register unit according to a fourth embodiment of the present disclosure.

The fourth embodiment involves another improvement to the shift register unit by replacing the NMOS transistors in the second embodiment with PMOS transistors. As shown in FIG. 10, the fourth embodiment can be implemented using the same structure as that of the second embodiment for the NMOS transistors, with the source voltage being changed from VGL to VGH.

The embodiments of the shift register unit and the gate driver according to the present disclosure have been described in detail. In addition, the present disclosure further provides an image display apparatus including the above gate driver. In particular, the display apparatus can be a Liquid Crystal Display (LCD) apparatus, e.g., a LCD panel, a LCD TV, a mobile phone, an e-reader, a LCD display, or the like.

The object, solutions and advantageous effects of the present disclosure have been explained above in detail with reference to the specific embodiments. However, it can be appreciated that the present disclosure is not limited to the specific embodiments as described above. Rather, any modifications, equivalents and improvements made without departing from the spirit and principle of the present disclosure are to be encompassed by the scope of the present disclosure.

What is claimed is:

1. A shift register unit, comprising:
   an input circuit configured to provide a first input signal to a first node based on a first clock signal;
   a first control circuit connected to the input circuit at the first node and configured to provide a pull-up output by providing a third clock signal to an output node of the shift register unit based on the first input signal and the third clock signal, and then provide a pull-down output by providing a source voltage to the output node based on a second input signal that is provided by the input circuit to the first node based on a second clock signal; and
   a second control circuit configured to maintain a level at the output node at the source voltage based on a fourth clock signal,
   wherein the first control circuit comprises a first transistor that remains on after the pull-up output to provide the pull-down output, and wherein the second control circuit comprises a second transistor that maintains the level at the output node; and
   wherein the second transistor has its gate connected to a second node, its drain connected to the source voltage and its source connected to the output node;
   wherein the second control circuit further comprises: a fifth transistor having its gate and drain connected to the fourth clock signal and its source connected to the second node; and a sixth transistor having its gate connected to the second node, its source connected to the first node and its drain connected to the source voltage.

2. The shift register unit of claim 1, wherein a ratio of a size of the first transistor to that of the second transistor is 30:1~1:1.

3. The shift register unit of claim 2, wherein the ratio of the size of the first transistor to that of the second transistor is 6:1~3:1.

4. The shift register unit of claim 1, wherein the first transistor has its gate connected to the first node, its source connected to the third clock signal and its drain connected to the output node, and wherein a first capacitance is provided between the gate and the drain of the first transistor, as a voltage maintenance capacitance for the first node;
   wherein the first control circuit further comprises a seventh transistor having its gate connected to the first node, its source connected to a first terminal of a second capacitance at the second node, and its drain connected to the source voltage;
   wherein the second capacitance has a second terminal connected to the source voltage and serves as a voltage maintenance capacitance for the second node.

5. The shift register unit of claim 4, wherein the first and second capacitances are provided by inherent parasitic capacitances or additional capacitors between the transistors.

6. The shift register unit of claim 1, wherein the second control circuit further comprises: an eighth transistor having its gate and drain connected to the second clock signal and its source connected to the second node; and a ninth transistor having its gate connected to the first clock signal, its source connected to the second node and its drain connected to a second source voltage having an opposite polarity to that of the source voltage.

7. The shift register unit of claim 6, wherein the input circuit comprises:
   a third transistor having its gate connected to the first clock signal, its source connected to the first input signal and its drain connected to the first node; and
   a fourth transistor having its gate connected to the fourth clock signal, its drain connected to the second input signal and its source connected to the first node.

8. The shift register unit of claim 6, wherein the input circuit comprises:
- a third transistor having its gate connected to the first input signal, its source connected to the first clock signal and its drain connected to the first node; and
- a fourth transistor having its gate connected to the second input signal, its drain connected to the fourth clock signal and its source connected to the first node.

9. The shift register unit of claim 1, wherein the input circuit comprises:
- a third transistor having its gate connected to the first clock signal, its source connected to the first input signal and its drain connected to the first node; and
- a fourth transistor having its gate connected to the fourth clock signal, its drain connected to the second input signal and its source connected to the first node.

10. The shift register unit of claim 9, wherein each of the first transistor, the second transistor, the third transistor, the fourth transistor, the fifth transistor, and the sixth transistor is an NMOS transistor, the source voltage is negative.

11. The shift register unit of claim 1, wherein the input circuit comprises:
- a third transistor having its gate connected to the first input signal, its source connected to the first clock signal and its drain connected to the first node; and
- a fourth transistor having its gate connected to the second input signal, its drain connected to the fourth clock signal and its source connected to the first node.

12. The shift register unit of claim 11, wherein each of the first transistor, the second transistor, the third transistor, the fourth transistor, the fifth transistor, and the sixth transistor is a PMOS transistor, the source voltage is positive.

13. A gate driving circuit, comprising the shift register unit according to claim 1.

14. The gate driving circuit of claim 13, wherein the gate driving circuit consists of N cascaded shift register units, where N is an integer larger than 1, and
- each of the shift register units, except the one at the first stage, has its first input terminal connected to the output node of the shift register unit at the previous stage, and the shift register unit at the first stage has its first input terminal connected to a first enabling signal,
- each of the shift register units, except the one at the last stage, has its second input terminal connected to the output node of the shift register unit at the next stage, and the shift register unit at the last stage has its second input terminal connected to a second enabling signal,
- when each shift register unit shifts forward, a high level pulse of the first clock signal occurs prior to that of the third clock signal, and the first clock signal has a waveform identical to that of a voltage at the output node of the shift register unit at the previous stage, and
- when each shift register unit shifts reversely, a high level pulse of the second clock signal occurs prior to that of the third clock signal, and the second clock signal has a waveform identical to that of a voltage at the output node of the shift register unit at the next stage.

15. A display apparatus comprising the gate driving circuit according to claim 13.

16. A display apparatus comprising the gate driving circuit according to claim 14.

* * * * *